(12) United States Patent
Sato et al.

(10) Patent No.: US 10,403,587 B2
(45) Date of Patent: Sep. 3, 2019

(54) RADIO FREQUENCY CIRCUIT, WIRELESS COMMUNICATION DEVICE, AND METHOD OF MANUFACTURING RADIO FREQUENCY CIRCUIT

(71) Applicant: FUJITSU LIMITED, Kawasaki-shi, Kanagawa (JP)

(72) Inventors: Masaru Sato, Isehara (JP); Yukiyasu Furukawa, Akiruno (JP)

(73) Assignee: FUJITSU LIMITED, Kawasaki (JP)

( * ) Notice: Subject to any disclaimer, the term of this patent is extended or adjusted under 35 U.S.C. 154(b) by 173 days.

(21) Appl. No.: 15/945,778

(22) Filed: Apr. 5, 2018

(65) Prior Publication Data

US 2018/0315721 A1 Nov. 1, 2018

(30) Foreign Application Priority Data

Apr. 26, 2017 (JP) ................. 2017-087500

(51) Int. Cl.
*H01L 23/66* (2006.01)
*H01L 23/492* (2006.01)
(Continued)

(52) U.S. Cl.
CPC ............ *H01L 23/66* (2013.01); *H01L 21/486* (2013.01); *H01L 21/4817* (2013.01);
(Continued)

(58) Field of Classification Search
CPC ... H01L 21/76898; H01L 23/66; H01L 24/13; H01L 23/481; H01L 23/5227; H01L 31/18; H01L 21/268; H01L 21/30625; H01L 24/11; H01L 21/02107; H01L 2223/6616; H01L 2924/12042; H01L 24/16;
(Continued)

(56) References Cited

U.S. PATENT DOCUMENTS 9,172,132 B2 * 10/2015 Kam .................... H01Q 1/2283
2010/0213584 A1 * 8/2010 Ju ......................... H01L 23/055
257/660
(Continued)

FOREIGN PATENT DOCUMENTS

JP 63-091173 U 6/1988
JP 05-031251 U 4/1993
JP 2014-183126 9/2014

*Primary Examiner* — Roy Potter
(74) *Attorney, Agent, or Firm* — Fujitsu Patent Center (57) ABSTRACT

A radio frequency circuit includes, a multilayer substrate having a grounded base metal and a plurality of insulating layers and wiring layers formed over the grounded base metal and having a recess surrounded by the plurality of insulating layers and wiring layers over the grounded base metal, an upper substrate having a through-hole penetrating the upper substrate, a first semiconductor chip mounted on the upper surface of the upper substrate and electrically coupled to a metal film formed on the lower surface of the upper substrate, a metal pillar formed on the upper surface of the grounded base metal in the recess, and a solder buried in the through-hole and bonded to the metal film and the upper surface of the metal pillar. The metal film is bonded to a ground wiring layer electrically coupled to the grounded base metal among the plurality of wiring layers.

15 Claims, 10 Drawing Sheets

(51) Int. Cl.
    H01L 23/498    (2006.01)
    H01L 21/48     (2006.01)
    H01L 25/065    (2006.01)
    H01L 25/00     (2006.01)
    H01Q 1/22      (2006.01)
    H01Q 1/48      (2006.01)
    H01L 23/049    (2006.01)

(52) U.S. Cl.
    CPC ...... *H01L 21/4853* (2013.01); *H01L 21/4857* (2013.01); *H01L 21/4875* (2013.01); *H01L 23/049* (2013.01); *H01L 23/492* (2013.01); *H01L 23/49822* (2013.01); *H01L 23/49827* (2013.01); *H01L 23/49838* (2013.01); *H01L 25/0657* (2013.01); *H01L 25/50* (2013.01); *H01Q 1/2283* (2013.01); *H01Q 1/48* (2013.01); *H01L 2223/6611* (2013.01); *H01L 2223/6616* (2013.01); *H01L 2223/6677* (2013.01); *H01L 2223/6683* (2013.01); *H01L 2225/0651* (2013.01); *H01L 2225/06548* (2013.01); *H01L 2225/06572* (2013.01)

(58) Field of Classification Search
    CPC ..... H01L 2224/131; H01L 2224/16227; H01L 2224/13025; H01L 2224/16225; H01L 2924/11; H01L 2924/014; H01L 2924/00014; H01L 2924/00; H01L 31/107; H01L 27/14643; G01N 21/64
    See application file for complete search history.

(56) References Cited

U.S. PATENT DOCUMENTS

2011/0006862 A1*  1/2011  Yasooka ............... H01L 23/055
                                                    333/230
2014/0264788 A1   9/2014  Masuda

* cited by examiner

RADIO FREQUENCY CIRCUIT, WIRELESS COMMUNICATION DEVICE, AND METHOD OF MANUFACTURING RADIO FREQUENCY CIRCUIT

CROSS-REFERENCE TO RELATED APPLICATION

This application is based upon and claims the benefit of priority of the prior Japanese Patent Application No. 2017-087500, filed on Apr. 26, 2017, the entire contents of which are incorporated herein by reference.

FIELD

The embodiments discussed herein are related to a radio frequency circuit, a wireless communication device, and a method of manufacturing the radio frequency circuit.

BACKGROUND

In response to a demand for miniaturization of a radio frequency circuit, there has been proposed a radio frequency circuit including a plurality of semiconductor chips laminated in three dimensions. For example, a radio frequency circuit is known in which an upper substrate on which a semiconductor chip is mounted is mounted in a recess of a multilayer substrate including a grounded base metal.

Various methods of grounding a circuit and an element formed on a substrate are known. It is known, for example, to insert a projection of a ground metal located on the lower side of a substrate into a through-hole penetrating the substrate, thereby coupling the ground pattern of a circuit formed on the upper surface of the substrate to the ground metal. As another example, it is known to couple a ground terminal of a semiconductor element formed on the upper surface of a substrate to a ground metal formed on the lower surface of the substrate by a solder buried in a through-hole penetrating the substrate.

Related technologies are disclosed in, for example, Japanese Laid-Open Patent Publication No. 2014-183126, Japanese Laid-Open Utility Model Publication No. 63-91173, and Japanese Laid-Open Utility Model Publication No. 05-031251.

SUMMARY

According to an aspect of the embodiments, a radio frequency circuit includes, a multilayer substrate having a grounded base metal and a plurality of insulating layers and wiring layers formed over the grounded base metal and having a recess surrounded by the plurality of insulating layers and wiring layers over the grounded base metal, an upper substrate having a through-hole penetrating the upper substrate, a first semiconductor chip mounted on the upper surface of the upper substrate and electrically coupled to a metal film formed on the lower surface of the upper substrate, a metal pillar formed on the upper surface of the grounded base metal in the recess, and a solder buried in the through-hole and bonded to the metal film and the upper surface of the metal pillar. The metal film is bonded to a ground wiring layer electrically coupled to the grounded base metal among the plurality of wiring layers.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the technique disclosed in Japanese Laid-Open Patent Publication No. 2014-183126, in order to obtain good propagation characteristics, a base metal and a metal film formed on the lower surface of an upper substrate are coupled by a metal pillar. That is, one end of the metal pillar is in contact with the upper surface of the grounded base metal and the other end thereof is in contact with the metal film. However, since manufacturing tolerances occur in the manufacture of objects, manufacturing tolerances also occur in the height of the metal pillar. For this reason, there may be a case where the grounded base metal and the metal film are not coupled by the metal pillar, and the ground potential of the metal film may become unstable, which may result in deteriorated signal propagation characteristics.

Hereinafter, embodiments of the present disclosure will be described with reference to the accompanying drawings.

First Embodiment

Figure 1A:
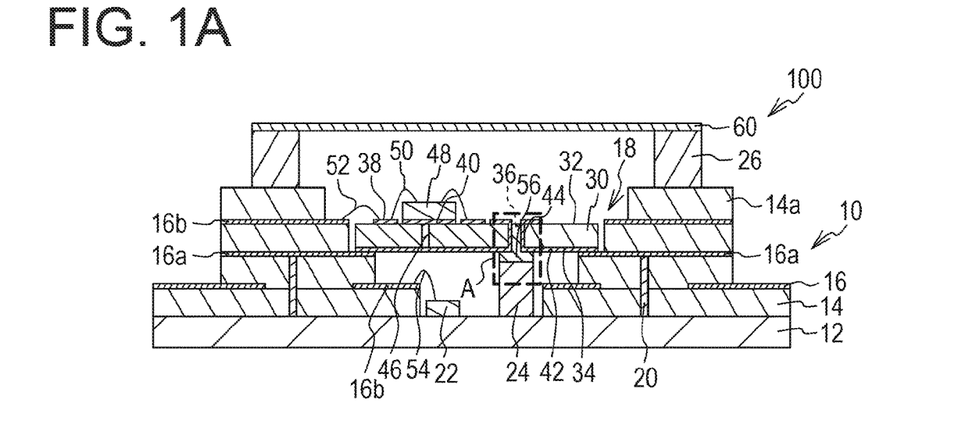
FIG. 1A is a sectional view of a radio frequency circuit according to a first embodiment.
Figure 1B:
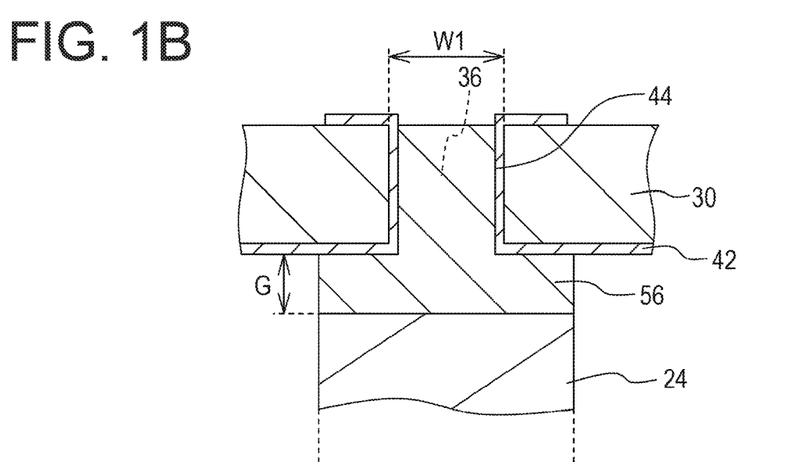
FIG. 1B is an enlarged view of a region A in FIG. 1A.
Figure 1C:
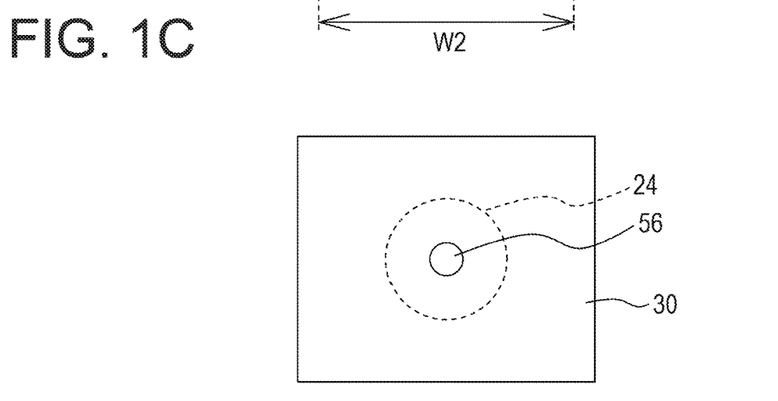
FIG. 1C is a top view of FIG. 1B.

FIG. 1A is a sectional view of a radio frequency circuit 100 to a first embodiment. FIG. 1B is an enlarged view of a region A in FIG. 1A. FIG. 1C is a top view of FIG. 1B. A metal film 44 is not illustrated in FIG. 1C. As illustrated in FIGS. 1A to 1C, the radio frequency circuit 100 of the first embodiment includes a multilayer substrate 10, an upper substrate 30, and a metal lid 60.

The multilayer substrate 10 has a grounded base metal 12 coupled and grounded to the ground, a plurality of insulating layers 14 and wiring layers 16 formed on the grounded base metal 12. A recess 18 surrounded by the plurality of insulating layers 14 and wiring layers 16 is formed on the grounded base metal 12. The upper surface of the grounded base metal 12 is exposed in a portion of the recess 18. The plurality of wiring layers 16 includes a ground wiring layer 16a electrically coupled to the grounded base metal 12 by a through-wiring 20 penetrating the insulating layers 14.

A semiconductor chip 22 is mounted on the upper surface of the grounded base metal 12 exposed at the recess 18 of the multilayer substrate 10. The semiconductor chip 22 is an integrated circuit chip such as a monolithic microwave integrated circuit (MMIC). A high frequency signal input/output terminal of the semiconductor chip 22 is coupled to a signal wiring layer 16b through which a high frequency signal propagates, among the plurality of wiring layers 16 of the multilayer board 10, by a bonding wire 54. Since the semiconductor chip 22 is mounted on the upper surface of the grounded base metal 12, a ground terminal of the semiconductor chip 22 is coupled to the ground. In addition, since the semiconductor chip 22 is mounted on the upper surface of the grounded base metal 12, the heat generated in the semiconductor chip 22 is dissipated satisfactorily. It should be noted that other functional elements may be mounted on the upper surface of the grounded base metal 12.

Figure 2:
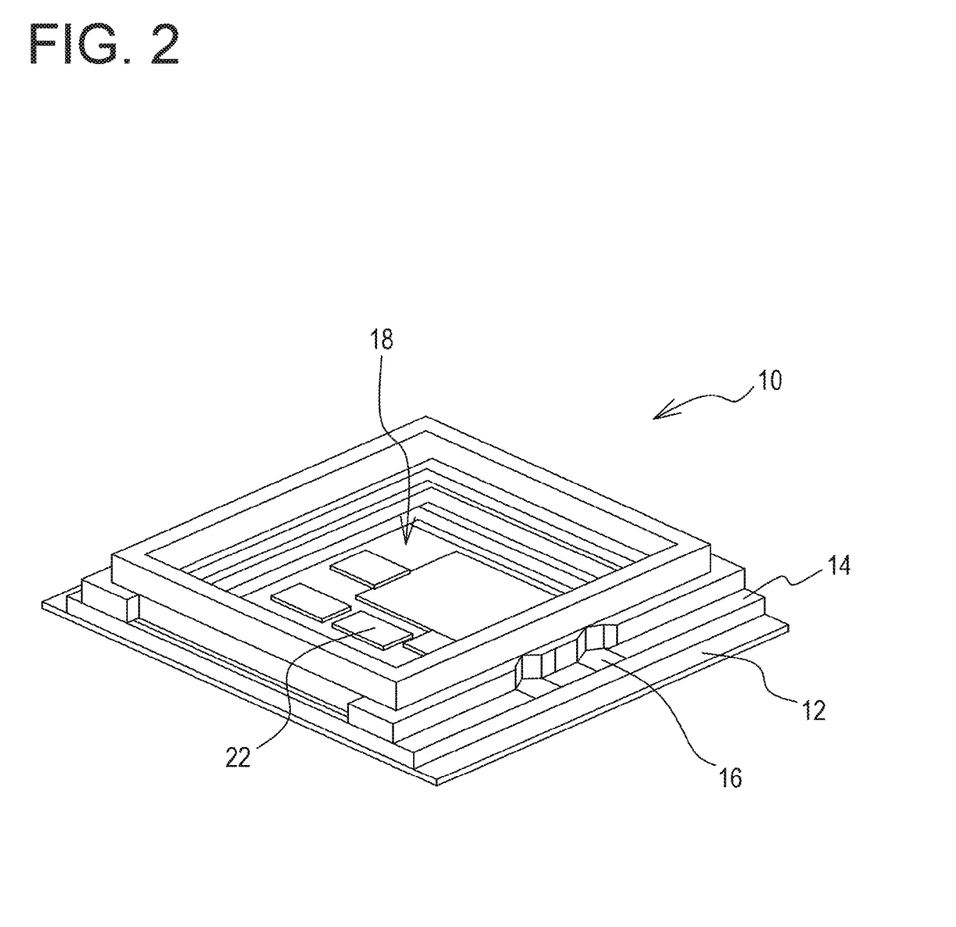
FIG. 2 is a perspective view of a multilayer substrate.

FIG. 2 is a perspective view of the multilayer substrate 10. As illustrated in FIG. 2, in the multilayer substrate 10, the recess 18 completely surrounded by the insulating layer 14 and the wiring layer 16 is formed on the grounded base metal 12. The semiconductor chip 22 and the like are mounted on the upper surface of the grounded base metal 12 exposed at the recess 18.

The grounded base metal 12 is formed of a metal material such as copper (Cu) or an alloy containing copper (Cu) (e.g., copper tungsten (CuW)) and has a thickness of 1 mm or more. The insulating layer 14 is made of ceramic such as aluminum oxide ($Al_2O_3$) and has a thickness of 0.25 mm. The wiring layer 16 and the through-wiring 20 are made of a metal material such as, for example, tungsten (W), molybdenum (Mo), or copper (Cu). In a case where the multilayer substrate 10 is high temperature Co-fired ceramics (HTCC) or low temperature Co-fired ceramics (LTCC), since the multilayer substrate 10 is formed by sintering ceramics, the wiring layer 16 and the through-wiring 20 may be made of a high melting point metal such as tungsten (W) or molybdenum (Mo).

As illustrated in FIGS. 1A to 1C, the upper substrate 30 is mounted in the recess 18 of the multilayer substrate 10. The upper substrate 30 is provided with a through-hole 36 penetrating from the upper surface 32 to the lower surface 34. A wiring layer 38 and an electrode 40 are formed on the upper surface 32 of the upper substrate 30, and a metal film 42 is formed on the lower surface 34. A metal film 44 coupled to the metal film 42 is formed on the side surface of the through-hole 36. The metal film 44 may extend from the side surface of the through-hole 36 to the upper surface 32 of the upper substrate 30.

The electrode 40 is electrically coupled to the metal film 42 by a through-wiring 46 penetrating the upper substrate 30 from the upper surface 32 to the lower surface 34. The metal film 42 is formed, for example, on the entire lower surface 34 of the upper substrate 30. The upper substrate 30 is mounted in the recess 18 of the multilayer substrate 10 by soldering the metal film 42 formed on the lower surface 34 to the ground wiring layer 16a of the multilayer substrate 10. As a result, the metal film 42 is coupled to the grounded base metal 12 via the ground wiring layer 16a and the through-wiring 20.

The upper substrate 30 is made of ceramic such as aluminum oxide ($Al_2O_3$). The wiring layer 38, the electrode 40, the metal film 42, and the metal film 44 are made of a metal material such as copper (Cu) or an alloy containing copper (Cu) (e.g., copper tungsten (CuW)).

A metal pillar 24 is formed on the upper surface of the grounded base metal 12 in the recess 18 of the multilayer substrate 10. The height of the metal pillar 24 is lower than a distance between the grounded base metal 12 and the upper substrate 30 (i.e., a distance between the upper surface of the grounded base metal 12 and the upper surface of the ground wiring layer 16a) and is, for example, 0.5 mm. Therefore, the upper surface of the metal pillar 24 has a gap with the metal film 42 and is not in contact with the metal film 42. The metal pillar 24 is made of a metal material having high conductivity such as copper (Cu) or an alloy containing copper (Cu) (e.g., brass (CuZn)). For example, a gold (Au) plating may be applied to the surface of the metal pillar 24.

A solder 56, buried in the through-hole 36 formed in the upper substrate 30 and bonded to the metal film 42 and the upper surface of the metal pillar 24, is provided. The solder 56 is, for example, a gold tin (AuSn) solder or a tin silver (SnAg) solder. Thus, the metal film 42 is coupled to the grounded base metal 12 via the solder 56 and the metal pillar 24.

Although the through-hole 36 and the metal pillar 24 have a circular shape when viewed from the top, they may have a rectangular shape as well. The diameter W1 of the through-hole 36 is, for example, about 0.1 mm. The diameter W2 of the metal pillar 24 is larger than the diameter W1 of the through-hole 36 and is, for example, about 0.3 mm. The value (W1/G) obtained by dividing the diameter W1 of the through-hole 36 by the distance G between the metal pillar 24 and the metal film 42 is larger than 2 (W1/G)>2), as will be described in detailed later.

A semiconductor chip 48 is mounted on the upper surface 32 of the upper substrate 30. The semiconductor chip 48 is an integrated circuit chip such as a monolithic microwave integrated circuit (MMIC). A high frequency signal input/output terminal of the semiconductor chip 48 is coupled to the wiring layer 38 formed on the upper surface 32 of the upper substrate 30 by a bonding wire 50. Therefore, a high frequency signal input/output to/from the semiconductor chip 48 propagates through the wiring layer 38. The wiring layer 38 is coupled to the signal wiring layer 16b through which the high frequency signal propagates, by a bonding wire 52. Further, the semiconductor chip 48 is mounted on the electrode 40 electrically coupled to the metal film 42. As a result, the ground terminal of the semiconductor chip 48 is coupled to the ground. The semiconductor chip 48 is electrically coupled to the semiconductor chip 22 via, for example, the wiring layer 16, and the high frequency signal propagates between the semiconductor chip 48 and the semiconductor chip 22.

A frame 26 is formed on the uppermost insulating layer 14a of the plurality of insulating layers 14 of the multilayer substrate 10 so as to surround the recess 18 of the multilayer substrate 10. The frame 26 is made of a metal material such as copper. The metal lid 60 made of a metal material such as Kovar is bonded to the upper surface of the frame 26. The thickness of the metal lid 60 is, for example, about 0.3 mm. By bonding the metal lid 60 to the upper surface of the frame 26, the upper substrate 30 is sealed and protected by the multilayer substrate 10, the frame 26, and the metal lid 60.

Figure 3A:
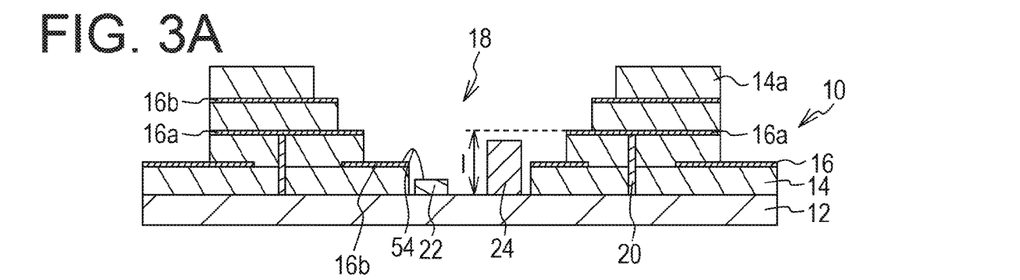
FIGS. 3A to 3D are sectional views illustrating a method of manufacturing a radio frequency circuit.

FIGS. 3A to 3D are sectional views illustrating a method of manufacturing the radio frequency circuit 100. First, as illustrated in FIG. 3A, the multilayer substrate 10, having the grounded base metal 12 and the plurality of insulating layers 14 and wiring layers 16 formed on the grounded base metal 12, and having the recess 18 surrounded by the insulating layers 14 and the wiring layers 16, is prepared. Then, the metal pillar 24 is solder-bonded to the upper surface of the grounded base metal 12 in the recess 18 of the multilayer substrate 10, and the semiconductor chip 22 is mounted thereon. As for the metal pillar 24, a metal pillar is used which has a height lower than the interval I between the upper surface of the grounded base metal 12 and the upper surface of the ground wiring layer 16a of the multilayer substrate 10. The input/output terminal of the semiconductor chip 22 is coupled to the signal wiring layer 16b of the multilayer substrate 10 by bonding wire 54.

Figure 3B:
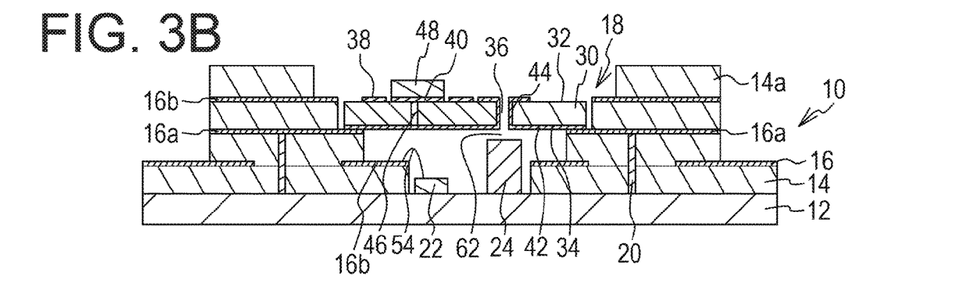

As illustrated in FIG. 3B, the upper substrate 30 is prepared which has the through-hole 36 penetrating from the upper surface 32 to the lower surface 34, the metal film 42 formed on the lower surface 34, the wiring layer 38 and the electrode 40 formed on the upper surface 32, and the metal film 44 formed on the side surface of the through-hole 36. Then, by soldering the metal film 42 to the ground wiring layer 16a of the multilayer substrate 10, the upper substrate 30 is mounted in the recess 18 of the multilayer substrate 10 with a gap 62 between the upper substrate 30 and the metal pillar 24. Note that the semiconductor chip 48 may be mounted on the upper surface of the upper substrate 30 before or after the upper substrate 30 is mounted in the recess 18 of the multilayer substrate 10.

Figure 3C:
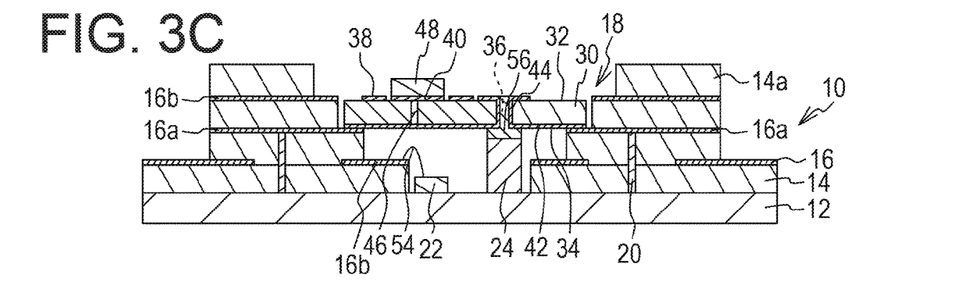

As illustrated in FIG. 3C, the solder 56 is supplied from the upper surface 32 side of the upper substrate 30 to the through-hole 36. The solder 56 supplied from the upper surface 32 side to the through-hole 36 penetrates the through-hole 36 toward the lower surface 34 side by a capillary phenomenon. Thereby, the metal film 42 and the upper surface of the metal pillar 24 are bonded by the solder 56.

Figure 3D:
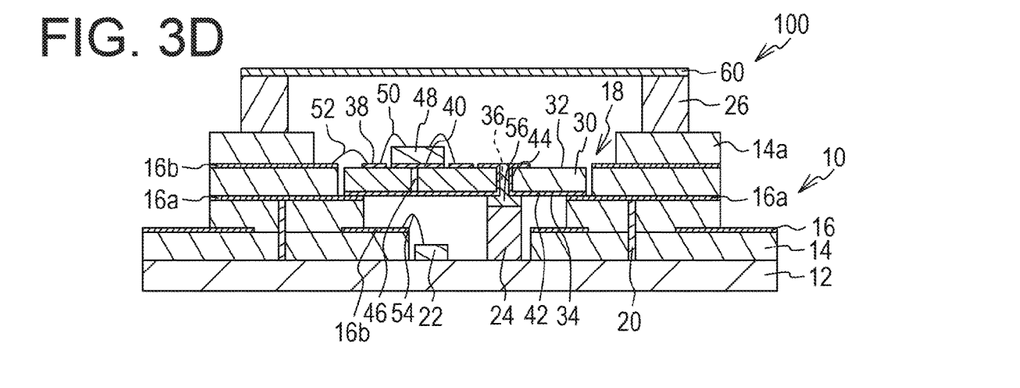

As illustrated in FIG. 3D, the input/output terminal of the semiconductor chip 48 and the wiring layer 38 are coupled by the bonding wire 50, and the wiring layer 38 and the signal wiring layer 16b are coupled by the bonding wire 52. Thereafter, the frame 26 is formed on the uppermost insulating layer 14a, and the metal lid 60 is solder-bonded to the upper surface of the frame 26.

Figure 4A:
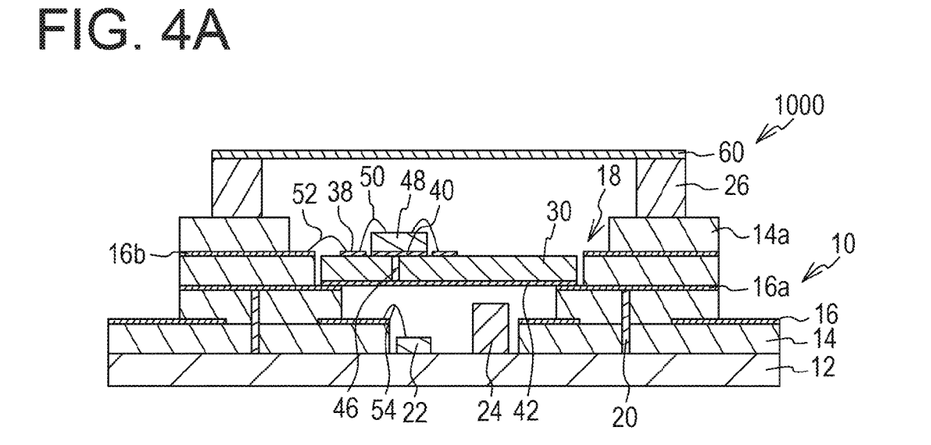
FIG. 4A is a sectional view of a radio frequency circuit according to a first Comparative Example.
Figure 4B:
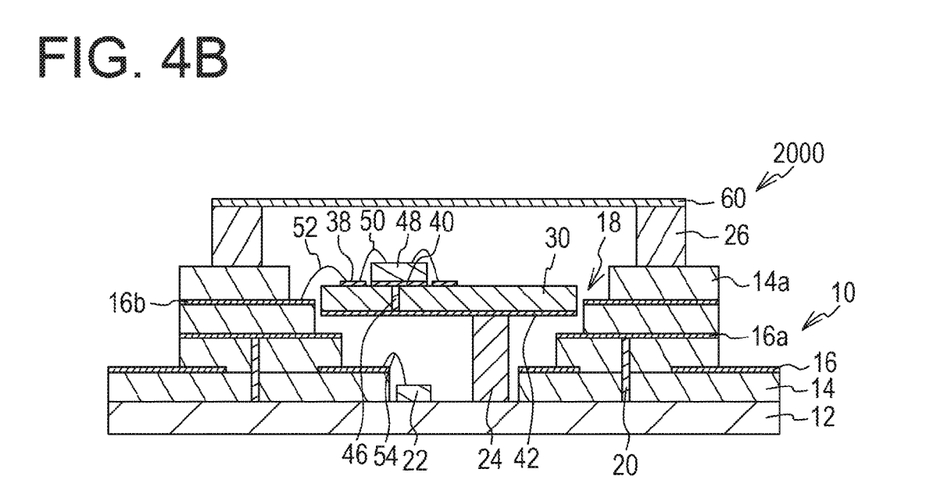
FIG. 4B is a sectional view of a radio frequency circuit according to a second Comparative Example.

Here, prior to describing the effects of the radio frequency circuit 100 of the first embodiment, radio frequency circuits of Comparative Examples will be first described. FIG. 4A is a sectional view of a radio frequency circuit 1000 according to a first Comparative Example, and FIG. 4B is a sectional view of a radio frequency circuit 2000 according to a second Comparative Example. As illustrated in FIG. 4A, in the radio frequency circuit 1000 of the first Comparative Example, the through-hole 36 is not formed in the upper substrate 30, and the height of the metal pillar 24 is smaller than the distance between the grounded base metal 12 and the upper substrate 30. Therefore, the metal pillar 24 is not in contact with the metal film 42. Since the other configuration is the same as that of the first embodiment, an explanation thereof will not be repeated. In this manner, in the radio frequency circuit 1000 of the first Comparative Example, since the metal pillar 24 is not in contact with the metal film 42, the ground potential of the metal film 42 becomes unstable.

As illustrated in FIG. 4B, in the radio frequency circuit 2000 of the second Comparative Example, the through-hole 36 is not formed in the upper substrate 30, and the height of the metal pillar 24 is larger than the distance between the upper surface of the grounded base metal 12 and the upper surface of the ground wiring layer 16a. Therefore, the metal film 42 is not in contact with the ground wiring layer 16a. Since the other configuration is the same as that of the first embodiment, an explanation thereof will not be repeated. In this manner, in the radio frequency circuit 2000 of the second Comparative Example, since the metal film 42 is not in contact with the ground wiring layer 16a, the ground potential of the metal film 42 becomes unstable.

When the ground potential of the metal film 42 coupled to the semiconductor chip 48 becomes unstable as in the first and second Comparative Examples, an unnecessary radio wave is radiated from the metal film 42. Since this unnecessary radio wave propagates into the recess 18 of the multilayer substrate 10, for example, unnecessary oscillation occurs in the semiconductor chip 22, and signal propagation characteristics are deteriorated. Since the metal processing precision generally has a manufacture tolerance of about 50 μm, it may happen that the height of the metal pillar 24 becomes lower or higher than the distance between the upper surface of the grounded base metal 12 and the upper surface of the ground wiring layer 16a.

In the meantime, in the radio frequency circuit 100 of the first embodiment, as illustrated in FIGS. 1A to 1C, the metal pillar 24 having the height smaller than the distance between the grounded base metal 12 and the upper substrate 30 is formed on the upper surface of the grounded base metal 12. Then, the upper surface of the metal pillar 24 and the metal film 42 are bonded by the solder 56 buried in the through-hole 36 of the upper substrate 30. Thereby, even when the metal pillar 24 has a manufacture tolerance, it is possible to bond the metal film 42 to the ground wiring layer 16a and to bond the metal pillar 24 with the solder 56. Therefore, since the metal film 42 is coupled to the grounded base metal 12 via the ground wiring layer 16a and the through-wiring 20 and is coupled to the grounded base metal 12 via the solder 56 and the metal pillar 24, it is possible to suppress the ground potential of the metal film 42 from becoming unstable. By stabilizing the ground potential of the metal film 42, emission of an unnecessary radio wave from the metal film 42 is suppressed and propagation of an unnecessary radio wave into the recess 18 of the multilayer substrate 10 are suppressed. Therefore, good signal propagation characteristics may be obtained.

In addition, according to the first embodiment, as illustrate in FIG. 3A, the metal pillar 24 having the height I smaller than the distance between the grounded base metal 12 and the ground wiring layer 16a is bonded to the upper surface of the grounded base metal 12 in the recess 18 of the multilayer substrate 10. As illustrated in FIG. 3B, by bonding the metal film 42 to the ground wiring layer 16a, the upper substrate 30 is mounted in the recess 18 of the multilayer substrate 10. As illustrated in FIG. 3C, by supplying the solder 56 from the upper surface 32 side of the upper substrate 30 to the through-hole 36, the metal film 42 is bonded to the upper surface of the metal pillar 24 by the solder 56 buried in the through-hole 36. Thereby, even when the metal pillar 24 has a manufacture tolerance, it is possible to bond the metal film 42 to the ground wiring layer 16a and to bond the metal pillar 24 with the solder 56. Therefore, it is possible to suppress the ground potential of the metal film 42 from becoming unstable and an unnecessary radio wave from being emitted from the metal film 42. Therefore, good signal propagation characteristics may be obtained. In addition, since the solder 56 is supplied from the upper surface 32 side of the upper substrate 30 to the through-hole 36, the supply amount of the solder 56 may be adjusted while visually confirming the condition of supply of the solder 56 to the upper surface of the metal pillar 24.

Further, according to the first embodiment, as illustrated in FIG. 1A, the semiconductor chip 22 is provided to be mounted on the upper surface of the grounded base metal 12 at the recess 18 of the multilayer substrate 10 and electrically coupled to the semiconductor chip 48. In the case where the semiconductor chip 22 is mounted in the recess 18 of the multilayer substrate 10, when an unnecessary radio wave propagates through the recess 18 of the multilayer substrate 10, for example, unnecessary oscillation occurs in the semiconductor chip 22, which is likely to deteriorate signal propagation characteristics. However, according to the first embodiment, propagation of the unnecessary radio wave into the recess 18 of the multilayer substrate 10 may be suppressed, so that deterioration of signal propagation characteristics may be suppressed even when the semiconductor chip 22 is mounted.

Figure 5:
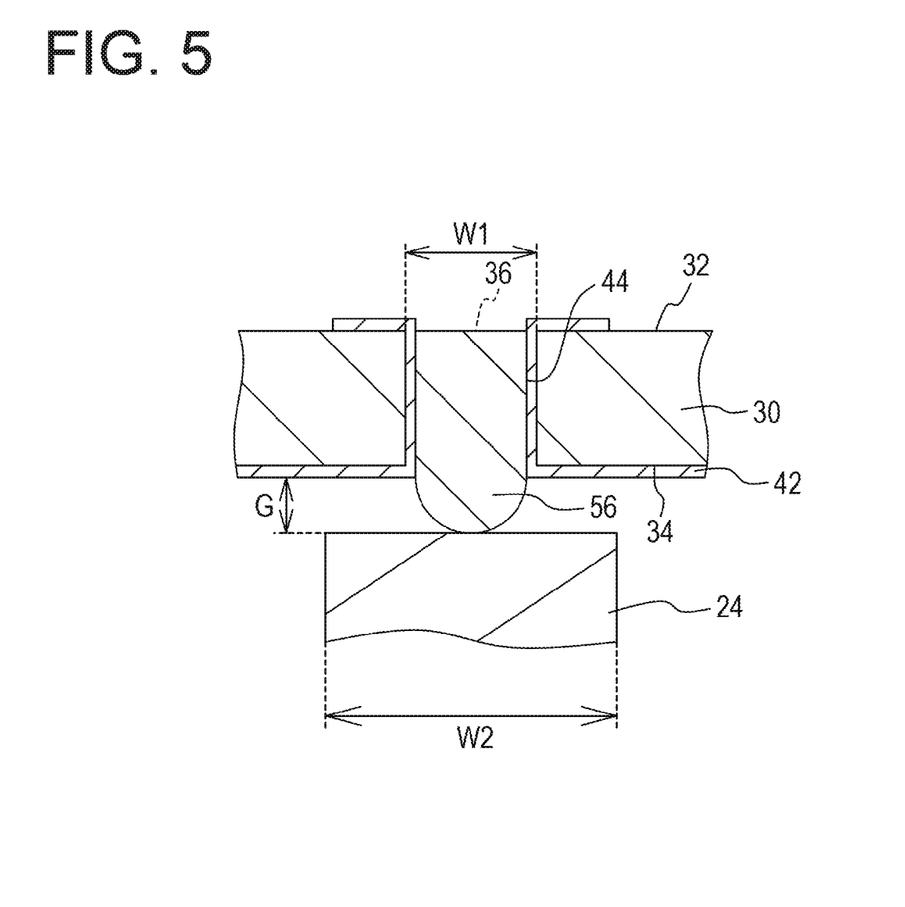
FIG. 5 is a view for explaining an effect obtained when a value obtained by dividing the diameter of a through-hole by a distance between a metal pillar and a metal film is set to be larger than 2.

According to the first embodiment, as described above, the value (W1/G) obtained by dividing the diameter W1 of the through-hole 36 by the distance G between the metal pillar 24 and the metal film 42 is larger than 2 ((W1/G)>2). The effect of this will be explained with reference to FIG. 5. FIG. 5 is a view for explaining the effect obtained when the value obtained by dividing the diameter W1 of the through-hole 36 by the distance G between the metal pillar 24 and the metal film 42 is larger than 2. As illustrated in FIG. 5, when the solder 56 is filled in the through-hole 36 from the upper surface 32 side of the upper substrate 30, the solder 56 bulges spherically and protrudes from the through-hole 36 due to the surface tension. At this time, when the distance G between the metal pillar 24 and the metal film 42 is shorter than the radius of the spherical solder 56 protruding from the through-hole 36, the solder 56 comes into contact with the metal pillar 24, and the metal film 42 and the metal pillar 24 are easily bonded with the solder 56. Since the diameter W1 of the through-hole 36 is substantially equal to the diameter of the solder 56, when (W1/2)>G is satisfied, the metal film 42 is easily bonded to the metal pillar 24 by the solder 56. That is, by satisfying (W1/G)>2, the metal film 42 is easily bonded to the metal pillar 24 by the solder 56.

The metal pillar 24 may be made of copper (Cu) or a material containing copper (Cu) such as an alloy containing copper (Cu). As a result, the metal pillar 24 having high conductivity may be obtained, and the ground potential of the metal film 42 may be effectively stabilized.

As illustrated in FIGS. 1A and 1B, the metal film 44 coupled to the metal film 42 formed on the lower surface 34 of the upper substrate 30 may be formed on the side surface of the through-hole 36 of the upper substrate 30. Thereby, the metal film 42 and the metal pillar 24 may be more reliably and electrically coupled by the solder 56 filled in the through-hole 36.

Figure 6:
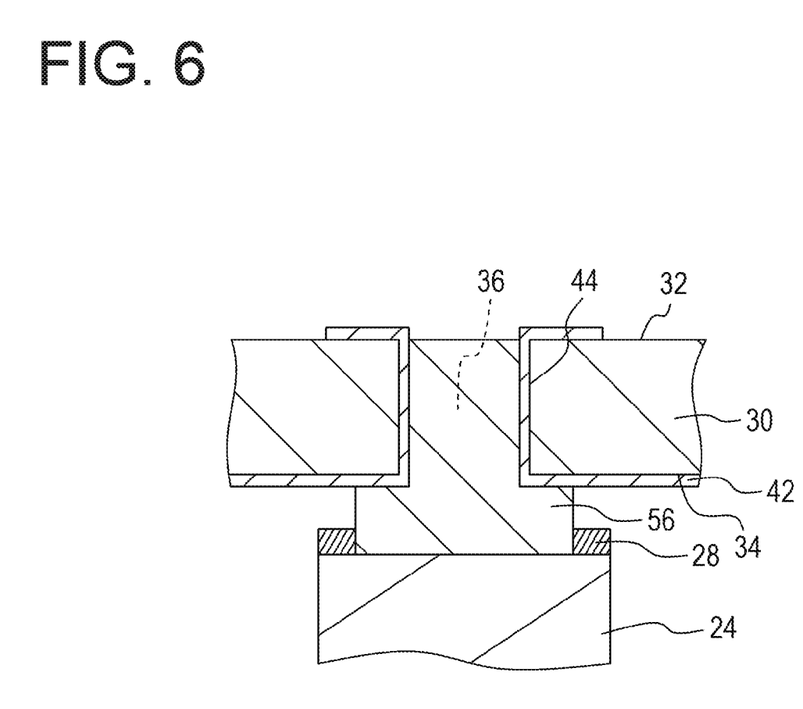
FIG. 6 is a sectional view of the vicinity of a metal pillar according to a first modification of the first embodiment.

FIG. 6 is a sectional view of the vicinity of the metal pillar 24 according to a first modification of the first embodiment. As illustrated in FIG. 6, in the first modification of the first embodiment, an additional film 28 is formed on the outer circumference of the upper surface of the metal pillar 24. For example, the additional film 28 is formed over the entire outer circumference of the upper surface of the metal pillar 24, but may be partially discontinued on the way. The additional film 28 is formed of an insulating film such as a resin film (organic film) such as polyimide or an inorganic film such as silicon oxide, but may be formed of a metal film. Since the other configuration is the same as that of the first embodiment, an explanation thereof will not be repeated.

According to the first modification of the first embodiment, the additional film 28 is formed on the outer circumference of the upper surface of the metal pillar 24. Thereby, it is possible to suppress the solder 56 from leaking out from the metal pillar 24 and being bonded to, for example, the semiconductor chip 22 or a circuit pattern.

The additional film 28 may be an insulating film. By using the additional film 28 as an insulating film, it is possible to suppress the solder 56 from wetting and spreading on the surface of the additional film 28 and it is possible to effectively suppress the solder 56 from leaking from the metal pillar 24.

Second Embodiment

Figure 7A:
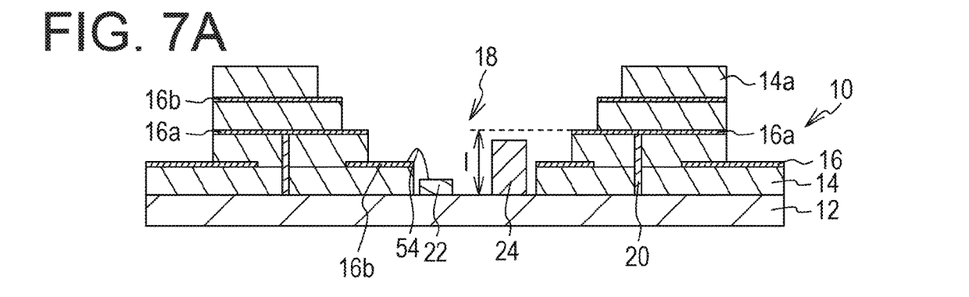
FIGS. 7A to 7D are sectional views illustrating another method of manufacturing the radio frequency circuit.

In a second embodiment, an example of another method of manufacturing the radio frequency circuit 100 illustrated in FIGS. 1A to 1C will be described. FIGS. 7A to 7D are sectional views illustrating another method of manufacturing the radio frequency circuit 100. As illustrated in FIG. 7A, the metal pillar 24 is solder-bonded to the upper surface of the grounded base metal 12 in the recess 18 of the multilayer substrate 10, and the semiconductor chip 22 is mounted thereon. As in the first embodiment, a metal pillar having the height smaller than the distance I between the upper surface of the grounded base metal 12 and the upper surface of the ground wiring layer 16a is used for the metal pillar 24. The input/output terminal of the semiconductor chip 22 is coupled to the signal wiring layer 16b of the multilayer substrate 10 by the bonding wire 54.

Figure 7B:
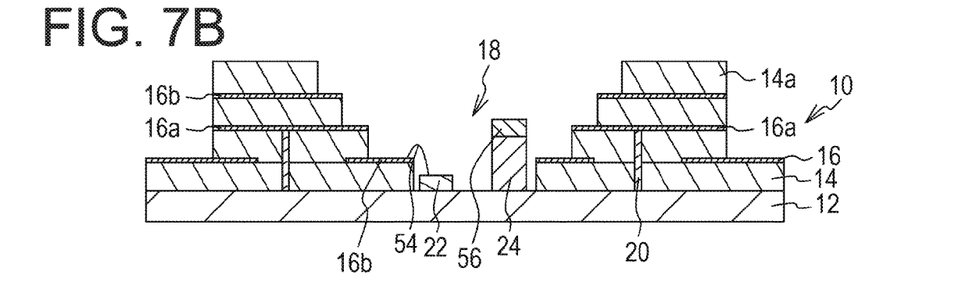

As illustrated in FIG. 7B, the solder 56 is formed on the upper surface of the metal pillar 24.

Figure 7C:
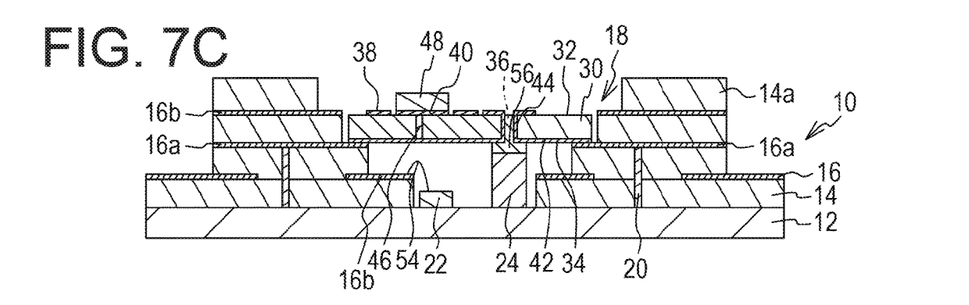

As illustrated in FIG. 7C, when the metal film 42 is solder-bonded to the ground wiring layer 16a of the multilayer substrate 10 and the upper substrate 30 is mounted in the recess 18 of the multilayer substrate 10, the upper surface of the metal pillar 24 is solder-bonded to the metal film 42 by using the solder 56 formed on the upper surface of the metal pillar 24. At this time, the through-hole 36 of the upper substrate 30 is brought into contact with the solder 56. As a result, the solder 56 penetrates into the through-hole 36 toward the upper surface 32 side by the capillary phenomenon.

Figure 7D:
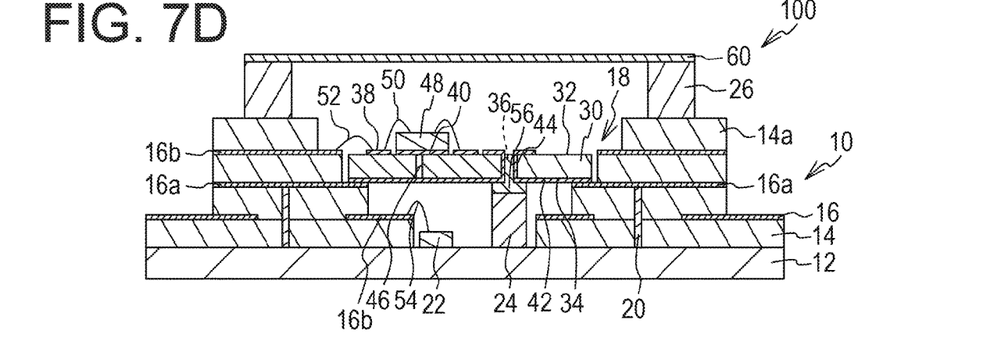

As illustrated in FIG. 7D, the semiconductor chip 48 and the wiring layer 38 are coupled with the bonding wire 50, and the wiring layer 38 and the signal wiring layer 16b are coupled by the bonding wire 52. Thereafter, the frame 26 is formed on the uppermost insulating layer 14a, and the metal lid 60 is solder-bonded to the upper surface of the frame 26.

According to the second embodiment, as illustrated in FIG. 7A, the metal pillar 24 having the height smaller than the distance between the grounded base metal 12 and the ground wiring layer 16a is bonded to the upper surface of the grounded base metal 12 in the recess 18 of the multilayer substrate 10. As illustrated in FIG. 7B, the solder 56 is formed on the upper surface of the metal pillar 24. As illustrated in FIG. 7C, when the metal film 42 is bonded to the ground wiring layer 16a and the upper substrate 30 is mounted in the recess 18 of the multilayer substrate 10, while the solder 56 penetrates into the through-hole 36, the metal film 42 is bonded to the upper surface of the metal pillar 24 by the solder 56. Thereby, even when the metal pillar 24 has a manufacture tolerance, it is possible to bond the metal film 42 to the ground wiring layer 16a and to bond the metal film 42 to the metal pillar 24 with the solder 56. Therefore, it is possible to suppress the ground potential of the metal film 42 from becoming unstable and to suppress unnecessary radio wave from being emitted from the metal film 42. Therefore, good signal propagation characteristics may be obtained. Further, by allowing the solder 56 to permeate into the through-hole 36 of the upper substrate 30, it is possible to suppress the solder 56 from leaking from the upper surface of the metal pillar 24.

Third Embodiment

Figure 8:
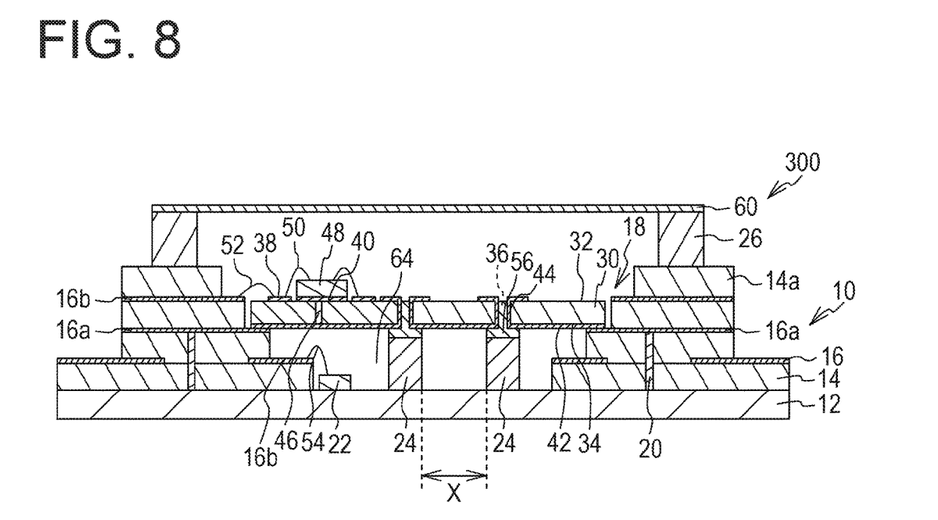
FIG. 8 is a sectional view of a radio frequency circuit according to a third embodiment.

FIG. 8 is a sectional view of a radio frequency circuit 300 according to a third embodiment. As illustrated in FIG. 8, in the radio frequency circuit 300 of the third embodiment, a plurality of metal pillars 24 are bonded to the upper surface of the grounded base metal 12 in the recess 18 of the multilayer substrate 10. The interval X between the plurality of metal pillars 24 is equal to or less than half of the wavelength λ of an unnecessary radio wave propagating in a space 64 between the grounded base metal 12 and the upper substrate 30 (X≤λ/2). Since the other configuration is the same as that of the first embodiment, an explanation thereof will not be repeated.

According to the third embodiment, the plurality of metal pillars 24 are formed in the recess 18 of the multilayer substrate 10, and the interval X between the plurality of metal pillars 24 is equal to or less than half of the wavelength λ of a radio wave propagating in the space 64 between the grounded base metal 12 and the upper substrate 30. In this manner, by setting the interval between the metal pillars 24 to be equal to or less than half of the wavelength of the radio wave propagating in the space 64, it is possible to shut off the mode of transmission of electromagnetic waves, so that an unnecessary radio wave propagating in the space 64 may be effectively suppressed and good signal propagation characteristics may be obtained.

Fourth Embodiment

Figure 9:
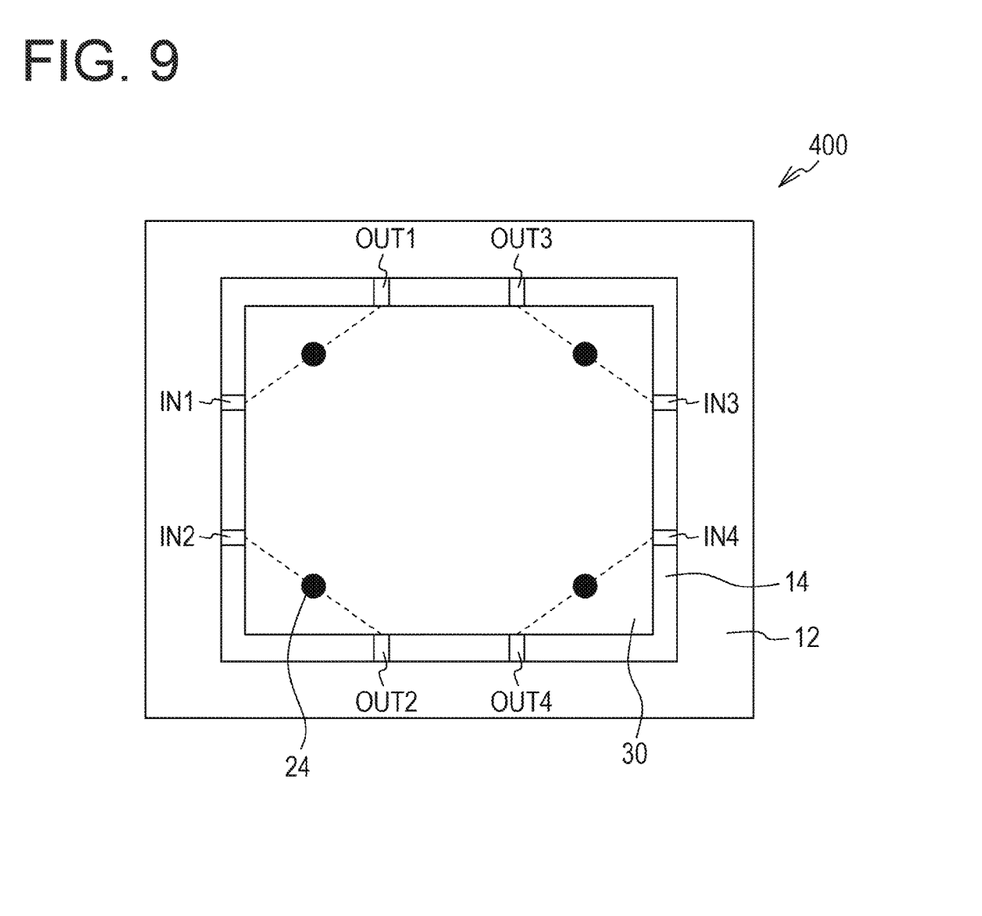
FIG. 9 is a top view of a radio frequency circuit according to a fourth embodiment.

FIG. 9 is a plan view of a radio frequency circuit 400 according to a fourth embodiment. In FIG. 9, a metal pillar 24 is illustrated through the upper substrate 30. As illustrated in FIG. 9, in the radio frequency circuit 400 of the fourth embodiment, input electrodes IN1 to IN4 and output electrodes OUT1 to OUT4 corresponding to channels 1 to 4 are formed on the insulating layer 14 of the multilayer substrate 10. Specifically, the input electrode IN1 and the output electrode OUT1 are electrodes for inputting/outputting a high frequency signal of the channel 1, which is the first frequency band, to/from the outside. The input electrode IN2 and the output electrode OUT2 are electrodes for inputting/outputting a high frequency signal of the channel 2, which is the second frequency band, to/from the outside. The input electrode IN3 and the output electrode OUT3 are electrodes for inputting/outputting a high frequency signal of the channel 3 which is the third frequency band, to/from the outside. The input electrode IN4 and the output electrode OUT4 are electrodes for inputting/outputting a high frequency signal of the channel 4, which is the fourth frequency band, to/from the outside.

The metal pillar 24 is formed so as to be positioned on a straight line coupling an input electrode and an output electrode of one channel. Specifically, the metal pillar 24 is formed so as to be positioned on a straight line coupling the input electrode IN1 and the output electrode OUT1 of the channel 1, and on a straight line coupling the input electrode IN2 and the output electrode OUT2 of the channel 2. The metal pillar 24 is formed so as to be positioned on a straight line coupling the input electrode IN3 and the output electrode OUT3 of the channel 3, and on a straight line coupling the input electrode IN4 and the output electrode OUT4 of the channel 4. Since the other configuration is the same as that of the first embodiment, an explanation thereof will not be repeated.

According to the fourth embodiment, the metal pillar 24 is formed so as to be positioned on the straight line coupling the input electrode and the output electrode. This makes it possible to suppress the ground potential of the metal film 42 between the input electrode and the output electrode from becoming unstable and suppress unnecessary radio wave from being emitted from the metal film 42 between the input electrode and the output electrode. Therefore, for example, an unnecessary radio wave may be suppressed from returning from the output electrode to the input electrode, so that good signal propagation characteristics may be obtained. From the viewpoint of effectively suppressing the emission of unnecessary radio wave from the metal film 42 between the input electrode and the output electrode, as illustrated in FIG. 9, the metal pillar 24 may be formed on a straight line coupling the input electrode and the output electrode and at an intermediate point between the input electrode and the output electrode.

In addition, in the fourth embodiment, a plurality of metal pillars 24 may be formed at equal intervals on a straight line coupling the input electrode and the output electrode.

Fifth Embodiment

Figure 10A:
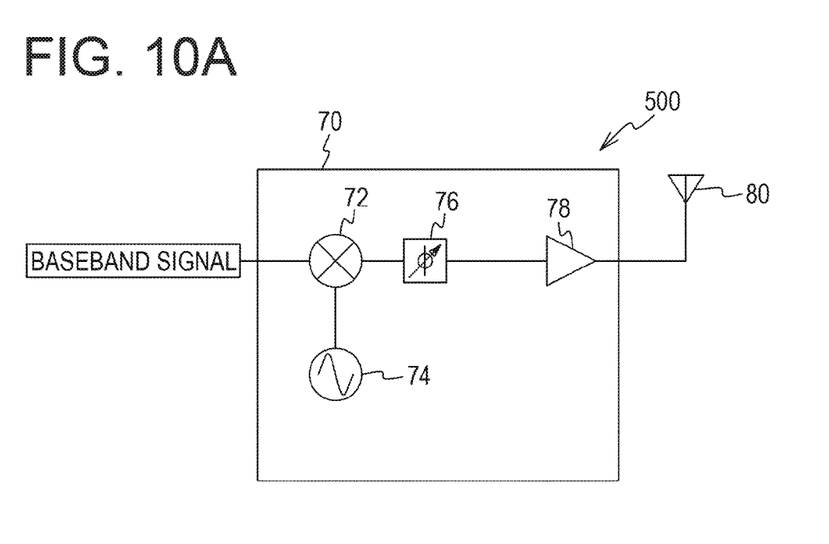
FIG. 10A is a view illustrating a wireless communication device according to a fifth embodiment.
Figure 10B:
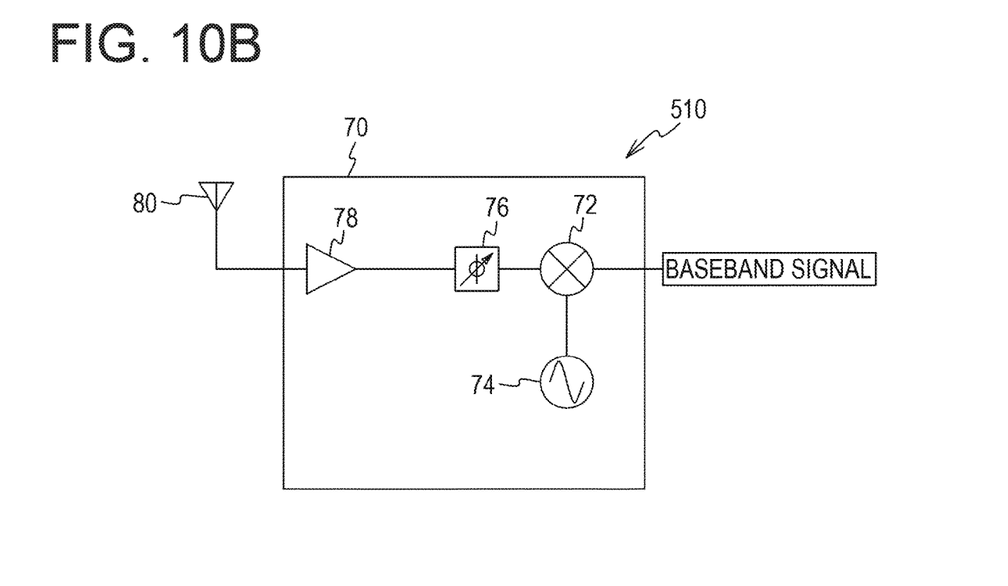
FIG. 10B is a view illustrating a wireless communication device according to a first modification of the fifth embodiment.

FIG. 10A is a view illustrating a wireless communication device 500 according to a fifth embodiment, and FIG. 10B is a view illustrating a wireless communication device 510 according to a first modification of the fifth embodiment. The wireless communication device 500 of the fifth embodiment is an example of a transmitter, and the wireless communication device 510 of the first modification of the fifth embodiment is an example of a receiver.

As illustrated in FIG. 10A, the wireless communication device 500 of the fifth embodiment, which is a transmitter, includes a radio frequency circuit 70 and an antenna 80 to which the radio frequency circuit 70 is coupled. The radio frequency circuit 70 includes a mixer 72, a local signal source 74, a variable phase shifter 76, and an amplifier 78. The mixer 72 mixes a baseband signal and a local signal output from the local signal source 74 to obtain a high frequency transmission signal which is output to the variable phase shifter 76. The variable phase shifter 76 shifts the phase of the transmission signal and outputs it to the amplifier 78. The amplifier 78 amplifies the transmission signal and outputs it to the antenna 80. The antenna 80 emits the transmission signal.

As illustrated in FIG. 10B, similarly to the wireless communication device 500 of the first embodiment, the wireless communication device 510 of the first modification of the fifth embodiment, which is a receiver, includes a radio frequency circuit 70 and an antenna 80 to which the radio frequency circuit 70 is coupled. The radio frequency circuit 70 includes a mixer 72, a local signal source 74, a variable phase shifter 76, and an amplifier 78. The antenna 80 receives a signal. The amplifier 78 amplifies the received signal and outputs it to the variable phase shifter 76. The variable phase shifter 76 shifts the phase of the received signal and outputs it to the mixer 72. The mixer 72 mixes the received signal and a local signal output from the local signal source 74 to obtain a baseband signal.

As the radio frequency circuit 70 included in the wireless communication device 500 of the fifth embodiment and the wireless communication device 510 of the first modification of the fifth embodiment, the radio frequency circuit described in the first to fourth embodiments may be used. Note that the wireless communication device may be a device other than a transmitter and a receiver.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A radio frequency circuit comprising:
   a multilayer substrate having a grounded base metal and a plurality of insulating layers and wiring layers formed over the grounded base metal and having a recess surrounded by the plurality of insulating layers and wiring layers over the grounded base metal;
   an upper substrate having a through-hole penetrating the upper substrate, mounted in the recess of the multilayer substrate, wherein a metal film formed on the lower surface of the upper substrate is bonded to a ground wiring layer electrically coupled to the grounded base metal among the plurality of wiring layers;
   a first semiconductor chip mounted on the upper surface of the upper substrate and electrically coupled to the metal film;
   a metal pillar formed on the upper surface of the grounded base metal in the recess of the multilayer substrate and having a height smaller than a distance between the grounded base metal and the upper substrate; and
   a solder buried in the through-hole of the upper substrate and bonded to the metal film and the upper surface of the metal pillar.

2. The radio frequency circuit according to claim 1, further comprising a second semiconductor chip mounted on the upper surface of the grounded base metal in the recess of the multilayer substrate and electrically coupled to the first semiconductor chip.

3. The radio frequency circuit according to claim 1, wherein a value obtained by dividing the diameter of the through-hole by a distance between the metal pillar and the metal film is larger than 2.

4. The radio frequency circuit according to claim 1, further comprising an additional film formed on the outer circumference of the upper surface of the metal pillar.

5. The radio frequency circuit according to claim 4, wherein the additional film is an insulating film.

6. The radio frequency circuit according to claim 1, wherein a plurality of metal pillars are formed in the recess of the multilayer substrate, and
   an interval between the plurality of metal pillars is equal to or less than half of a wavelength of a radio wave propagating in a space between the grounded base metal and the upper substrate.

7. The radio frequency circuit according to claim 1, further comprising an input electrode and an output electrode formed on the multilayer substrate,
   wherein the metal pillar is positioned on a straight line coupling the input electrode and the output electrode.

8. The radio frequency circuit according to claim 7, wherein the metal pillar is positioned on the straight line and at an intermediate point between the input electrode and the output electrode.

9. The radio frequency circuit according to claim 1, further comprising another metal film formed on the side surface of the through-hole and coupled to the metal film.

10. The radio frequency circuit according to claim 1, wherein the metal pillar is made of a material containing copper.

11. The radio frequency circuit according to claim 1, further comprising a metal lid bonded to the uppermost insulating layer among the plurality of insulating layers of the multilayer substrate via a frame, wherein the upper substrate is sealed by the multilayer substrate, the frame, and the metal lid.

12. A wireless communication device comprising:
    an antenna; and
    a radio frequency circuit coupled to the antenna,
    wherein the radio frequency circuit includes,
    a multilayer substrate having a grounded base metal and a plurality of insulating layers and wiring layers formed over the grounded base metal and having a recess surrounded by the plurality of insulating layers and wiring layers over the grounded base metal;
    an upper substrate having a through-hole penetrating the upper substrate, wherein a metal film formed on the lower surface of the upper substrate is bonded to a ground wiring layer electrically coupled to the grounded base metal among the plurality of wiring layers;
    a first semiconductor chip mounted on the upper surface of the upper substrate and electrically coupled to the metal film;
    a metal pillar formed on the upper surface of the grounded base metal in the recess of the multilayer substrate and having a height smaller than a distance between the grounded base metal and the upper substrate; and
    a solder buried in the through-hole of the upper substrate and bonded to the metal film and the upper surface of the metal pillar.

13. A method of manufacturing a radio frequency circuit, the method comprising:
    disposing a multilayer substrate having a grounded base metal and a plurality of insulating layers and wiring layers formed over the grounded base metal and having a recess surrounded by the plurality of insulating layers and wiring layers over the grounded base metal;
    disposing an upper substrate having a through-hole penetrating the upper substrate, in the recess of the multilayer substrate, wherein a metal film formed on the lower surface is bonded to a ground wiring layer electrically coupled to the grounded base metal among the plurality of wiring layers;
    forming a metal pillar having a height smaller than a distance between the grounded base metal and the upper substrate, on the upper surface of the grounded base metal in the recess of the multilayer substrate;
    mounting a first semiconductor chip on the upper surface of the upper substrate and electrically coupled to the metal film;
    burying a solder in the through-hole of the upper substrate; and
    bonding the solder to the metal film and the upper surface of the metal pillar.

14. The method of manufacturing a radio frequency circuit according to claim 13, wherein the burying includes supplying the solder into the through-hole of the upper substrate from the upper side of the upper substrate.

15. The method of manufacturing a radio frequency circuit according to claim 13, further comprising:
forming the solder on the metal pillar before the mounting the upper substrate in the recess of the multilayer substrate, wherein
the bonding includes, when the upper substrate is mounted in the recess of the multilayer substrate by bonding the metal film to the ground wiring layer, penetrating the solder formed on the metal pillar into the through-hole of the upper substrate.

* * * * *